(12) United States Patent
Grigg (10) Patent No.: US 6,622,380 B1
(45) Date of Patent: Sep. 23, 2003

(54) METHODS FOR MANUFACTURING MICROELECTRONIC DEVICES AND METHODS FOR MOUNTING MICROELECTRONIC PACKAGES TO CIRCUIT BOARDS

(75) Inventor: Ford B. Grigg, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/076,169

(22) Filed: Feb. 12, 2002

(51) Int. Cl.[7] .................................................. H05K 3/34

(52) U.S. Cl. ............................ 29/840; 29/832; 29/825; 228/180.22

(58) Field of Search ........................ 29/840, 832, 825; 228/180.22

(56) References Cited

U.S. PATENT DOCUMENTS

| | | | |
|---|---|---|---|
| 5,107,328 A | 4/1992 | Kinsman | |
| 5,128,831 A | 7/1992 | Fox, III et al. | |
| 5,138,434 A | 8/1992 | Wood et al. | |
| 5,593,927 A | 1/1997 | Farnworth et al. | |
| 5,677,566 A | 10/1997 | King et al. | |
| 5,696,033 A | 12/1997 | Kinsman | |
| 5,704,116 A | * 1/1998 | Gamota et al. | |
| 5,729,896 A | * 3/1998 | Dalal et al. | |
| 5,739,585 A | 4/1998 | Akram et al. | |
| 5,801,350 A | * 9/1998 | Shibuya et al. | |
| 5,815,000 A | 9/1998 | Farnworth et al. | |
| 5,842,273 A | * 12/1998 | Schar | |
| 5,851,845 A | 12/1998 | Wood et al. | |
| 5,866,953 A | 2/1999 | Akram et al. | |
| 5,891,753 A | 4/1999 | Akram | |
| 5,893,726 A | 4/1999 | Farnworth et al. | |
| 5,898,224 A | 4/1999 | Akram | |
| 5,933,713 A | 8/1999 | Farnworth | |
| 5,938,956 A | 8/1999 | Hembree et al. | |
| 5,946,553 A | 8/1999 | Wood et al. | |
| 5,958,100 A | 9/1999 | Farnworth et al. | |
| 5,985,043 A | * 11/1999 | Zhou et al. | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 6,008,070 A | 12/1999 | Farnworth | |
| 6,018,249 A | 1/2000 | Akram et al. | |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,066,514 A | 5/2000 | King et al. | |
| 6,072,233 A | 6/2000 | Corisis et al. | |
| 6,075,288 A | 6/2000 | Akram | |
| 6,081,429 A | 6/2000 | Barrett | |
| 6,089,920 A | 7/2000 | Farnworth et al. | |

(List continued on next page.)

Primary Examiner—Carl J. Arbes
(74) Attorney, Agent, or Firm—Perkins Coie LLP (57) ABSTRACT

Packaged microelectronic devices, methods of manufacturing packaged microelectronic devices, and method of mounting packaged microelectronic devices to printed circuit boards. One embodiment can include a die, an interposer substrate, a solder-ball, and a dielectric compound. The die can have an integrated circuit and at least one bond-pad coupled to the integrated circuit. The interposer substrate is coupled to the die and can have at least one ball-pad electrically coupled to the bond-pad on the die. The interposer substrate can also have a trace line adjacent to the ball-pad, and a solder-mask having an opening over the ball-pad. The solder-ball can contact the ball-pad in the opening. The dielectric compound can insulate the ball-pad and the solder-ball from an exposed portion of the adjacent trace line in the opening.

37 Claims, 7 Drawing Sheets

U.S. PATENT DOCUMENTS

| | | | |
|---|---|---|---|
| 6,094,058 A | 7/2000 | Hembree et al. |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,117,382 A | 9/2000 | Thummel |
| 6,124,634 A | 9/2000 | Akram et al. |
| 6,150,717 A | 11/2000 | Wood et al. |
| 6,159,764 A | 12/2000 | Kinsman et al. |
| 6,172,419 B1 | 1/2001 | Kinsman |
| 6,184,465 B1 | 2/2001 | Corisis |
| 6,189,208 B1 * | 2/2001 | Estes et al. |
| 6,198,172 B1 | 3/2001 | King et al. |
| 6,208,519 B1 | 3/2001 | Jiang et al. |
| 6,210,992 B1 | 4/2001 | Tandy et al. |
| 6,215,175 B1 | 4/2001 | Kinsman |
| 6,228,548 B1 | 5/2001 | King et al. |
| 6,228,687 B1 | 5/2001 | Akram et al. |
| 6,229,202 B1 | 5/2001 | Corisis |
| 6,246,108 B1 | 6/2001 | Corisis et al. |
| 6,258,623 B1 | 7/2001 | Moden et al. |
| 6,258,624 B1 | 7/2001 | Corisis et al. |
| 6,259,153 B1 | 7/2001 | Corisis et al. |
| 6,277,671 B1 | 8/2001 | Tripard |
| 6,284,571 B1 | 9/2001 | Corisis et al. |
| 6,291,894 B1 | 9/2001 | Farnworth et al. |
| 6,294,839 B1 | 9/2001 | Mess et al. |
| 6,303,981 B1 | 10/2001 | Moden |
| 6,303,985 B1 | 10/2001 | Larson et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,329,222 B1 | 12/2001 | Corisis et al. |
| 6,331,221 B1 | 12/2001 | Cobbley |
| 6,331,453 B1 | 12/2001 | Bolken et al. |
| 6,332,766 B1 | 12/2001 | Thummel |

* cited by examiner

METHODS FOR MANUFACTURING MICROELECTRONIC DEVICES AND METHODS FOR MOUNTING MICROELECTRONIC PACKAGES TO CIRCUIT BOARDS

TECHNICAL FIELD

The present invention relates to microelectronic device assemblies and methods for mounting packaged microelectronic devices to circuit boards.

BACKGROUND

Packaged microelectronic devices are used in cell phones, pagers, personal digital assistants, computers and many other products. A packaged microelectronic device typically includes a microelectronic die and an interposer substrate attached to the die. The die generally has an integrated circuit and a plurality of bond-pads coupled to the integrated circuit. The interposer substrate has a plurality of traces coupled to the bond pads on the die, numerous ball-pads that are electrically connected to the traces, and a solder-mask that covers the traces with openings over the ball-pads. The solder-mask is also referred to as the passivation or dielectric layer. An array of solder-balls is configured so that each solder-ball contacts a corresponding ball-pad to define a "ball-grid" array. Packaged microelectronic devices with ball-grid array connections generally have lower profiles and higher pin counts than conventional chip packages that use a lead frame.

Packaged microelectronic devices are typically mounted to circuit boards. When a ball-grid array is used to connect a packaged microelectronic device to a circuit board, the solder-balls are connected to contacts on the circuit board using surface mounting techniques. First, discrete volumes of a solder paste are deposited on the circuit board contacts. Next, the solder-balls are pressed into the solder paste on the contacts. As the packaged microelectronic device and the circuit board are pressed together, the solder-balls are surrounded by solder paste and touch, or are moved proximate to, the contacts on the circuit board. This assembly is then heated to reflow the solder so that the solder mechanically bonds and electrically connects the solder-balls to the contacts.

One concern about surface mounting ball-grid array packages to circuit boards is that electrical shorts can occur between traces on the interposer substrate and ball-pads and/or solder-balls that are adjacent to such traces. The shorting problem arises because the openings in the solder-mask layer may be too large. For example, an etching process is generally used to form the openings in the solder-mask, but the etching process may over etch the solder-mask and expose a portion of a trace adjacent to a ball-pad. When a portion of the adjacent trace is exposed, the conductive solder paste on the circuit board can create a short that renders the assembled microelectronic device and circuit board inoperable. The potential for shorts is especially problematic for high-density devices with high-density ball-grid arrays because the spacing between the traces and the ball-pads is very small.

It is very difficult for the manufacturer of the packaged microelectronic device to detect the problem of potential shorts. The difficulty arises because after etching and placement of the solder-balls on the ball-pads, the device will function properly in quality control testing even though an adjacent trace is exposed because quality control testing does not involve pressing the solder-ball onto a conductive paste. Thus, without a conductive paste to create a short, it is difficult for device manufacturers to detect faulty components that may have a short after being assembled to a circuit board.

The buyer of the packaged microelectronic device, however, will connect the device to a circuit board and discover the faulty components. If the device has an exposed trace in the opening with the solder-ball, solder paste can fill the gap between the exposed trace and the ball-pad and/or solder-ball when the solder-ball is placed in the solder paste. Alternatively, if the paste does not fill the gap initially, it might do so during the reflow process. The solder paste is conductive, and consequently, when the paste fills the gap between the exposed trace and the ball-pad and/or solder-ball, an electrical connection is created. In this case the electrical connection is a short. Accordingly, the packaged microelectronic device and the circuit board, which both worked properly before assembly, do not work properly after being assembled by the customer. After assembly it is more expensive to recover faulty parts than to replace them, and therefore, the faulty parts are generally discarded.

Because the shorting problem is most easily detected only after assembly, the problem often arises after the manufacturer has sold the packaged microelectronic device. Post-sale detection increases the magnitude of the problem for at least two reasons. First, the financial losses are greater because all of the manufacturing, inventory and marketing costs for the product have been incurred by the time the problem is detected. Yet, almost none of these costs can be recouped because the faulty parts are often discarded and replaced. Second, post-sale detection can damage customer relationships because defective products disrupt the customers' business and damage their reputation. Even if customers are compensated for their costs, the process is an inconvenience at the very least.

Manufacturers of packaged microelectronic devices want to produce products with high yields. Therefore, it is desirable to prevent shorting, or at the very least, detect the possibility of shorts early in the manufacturing process. One approach manufacturers use to prevent shorting is to improve the accuracy of the etching process. This approach, however, increases the cost of the etching process and is becoming more difficult as the density of microelectronic devices increases. Moreover, even if the accuracy of the etching process is improved, some traces may still be exposed and susceptible to shorting at assembly.

SUMMARY

The present invention is directed toward packaged microelectronic devices, methods of manufacturing packaged microelectronic devices, and methods of mounting packaged microelectronic devices on circuit boards. In an aspect of one embodiment of the invention related to packaged microelectronic devices, the device can have a die, an interposer substrate, a solder-ball and a dielectric compound. The die can have an integrated circuit and at least one bond-pad coupled to the integrated circuit. The interposer substrate is coupled to the die and can have at least one ball-pad electrically coupled to the bond-pad on the die. The interposer substrate can also have a trace line adjacent to the ball-pad and a solder-mask having an opening over the ball-pad. The solder-ball can contact the ball-pad in the opening, and the dielectric compound can insulate the ball-pad and the solder-ball from an exposed portion of the adjacent trace line in the opening.

Other embodiments of the invention can be directed toward methods of manufacturing packaged microelectronic devices. In an aspect of one embodiment of the invention, a method can include covering ball-pads on an interposer substrate with a solder-mask and forming an opening in the solder-mask over a ball-pad on the interposer substrate. The manufacturing procedure continues by depositing a dielectric compound in the opening and placing a solder-ball onto the ball-pad. In one embodiment of the invention, the solder-ball is placed so that the dielectric compound electrically insulates the ball-pad and the solder-ball from any exposed portion of a trace line adjacent to the ball-pad in the opening. In another embodiment of the invention, the solder-ball is placed so that the dielectric compound is displaced and surrounds a perimeter portion of the solder-ball.

Other embodiments of the invention can be directed toward methods of mounting packaged microelectronic devices to circuit boards. In an aspect of one embodiment of the invention, a method can include depositing a dielectric compound onto an exposed ball-pad in an opening of the packaged microelectronic device. The mounting procedure continues by placing a solder-ball onto the ball-pad so that the dielectric compound electrically insulates the ball-pad and the solder-ball from any exposed portion of a trace line adjacent to the ball-pad in the opening, and attaching a contact on the circuit board to the solder-ball of the microelectronic device.

DETAILED DESCRIPTION

The following description is directed toward packaged microelectronic devices, methods of manufacturing packaged microelectronic devices, and methods for mounting packaged microelectronic devices on circuit boards. Many specific details of several embodiments are described below with reference to circuit boards and packaged microelectronic devices having microelectronic dies to provide a thorough understanding of such embodiments. The present invention, however, can be practiced using other types of microelectronic devices or micromechanical devices. Those of ordinary skill in the art will thus understand that the invention may have additional embodiments, or that the invention may be practiced without several of the details described in this section.

A. Environment

Figure 1:
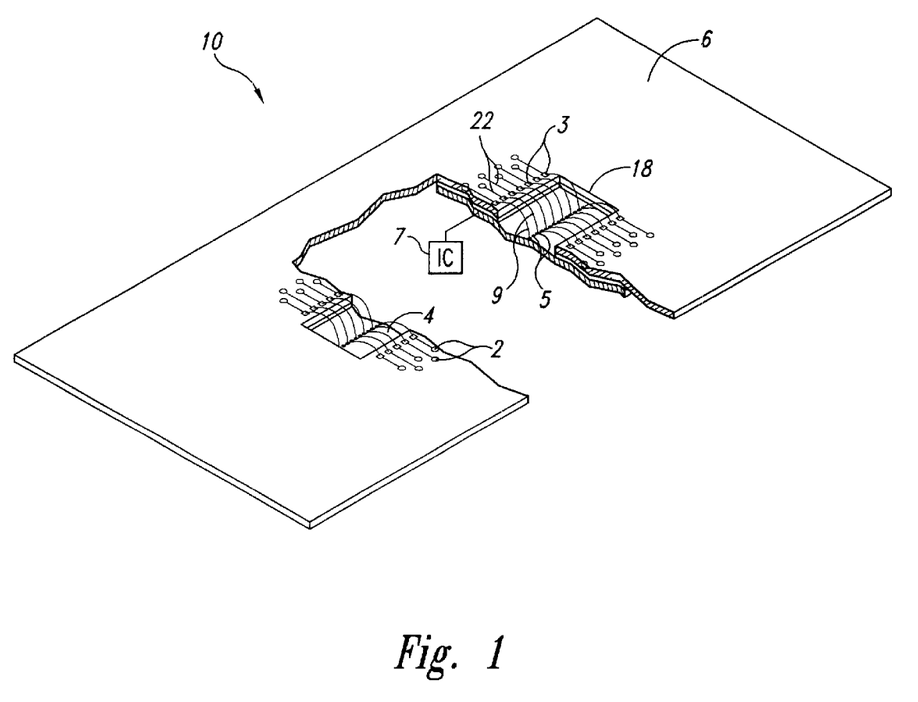
FIG. 1 is a top cutaway isometric view of a microelectronic device.

FIG. 1 is a top cutaway isometric view of a microelectronic device 10. The microelectronic device 10 can include a substrate 6 and a microelectronic die 4 attached to the substrate 6. The microelectronic device 10 shown in FIG. 1 illustrates the substrate 6 and the die 4. before encapsulating the die 4 with an encapsulation compound.

In the embodiment shown in FIG. 1, the substrate 6 includes a first array of ball-pads 2, a second array of terminal pads 3 proximate to a slot 18, and a trace 22 or other type of conductive line between each ball-pad 2 and corresponding terminal pad 3. The slot 18 extends lengthwise along a medial portion of the substrate 6. The substrate 6 can be a flexible material or a substantially rigid material, and the traces 22 can be conductive lines that are printed on the substrate 6 in a manner similar to printed circuit boards. The substrate 6 is generally an interposing device that provides an array of ball-pads for coupling very small contacts on the microelectronic die to another type of device.

The microelectronic die 4 can include a plurality of small, contacts 5 and an integrated circuit 7 (shown schematically) coupled to the contacts 5. The contacts 5 are arranged in an array on the microelectronic die 4 so that the contacts 5 are aligned with or otherwise accessible through the slot 18 in the substrate 6. A plurality of wire-bonds or other types of connectors 9 couple the contacts 5 of the die 4 to corresponding terminal pads 3 on the substrate 6. As such, the substrate 6 distributes the very small contacts 5 to the larger array of ball-pads 2.

Figure 2:
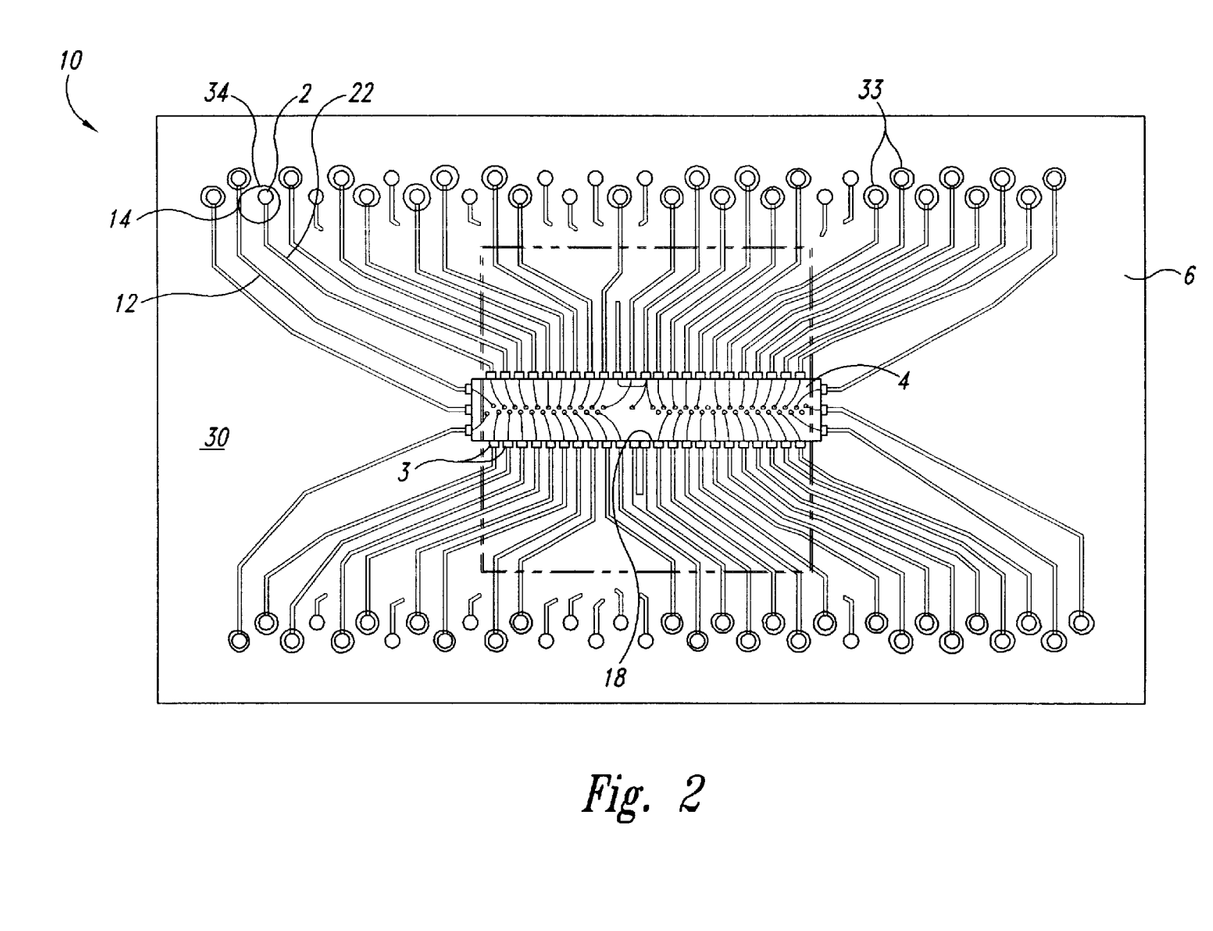
FIG. 2 is a top plan view of a microelectronic device.

FIG. 2 is a top plan view of the microelectronic device 10 showing the terminal pads 3 along the edge of the slot 18, the traces 22, and the ball-pads 2 in greater detail. In order to connect the interposer substrate 6 to a circuit board or other component, a solder-mask 30 (shown best in FIG. 3A) covers the traces 22 and openings 33 and 34 are formed exposing the ball-pads 2. The solder-mask layer 30 electrically isolates the traces 22 and the ball-pads 2 from each other.

The openings 33 and 34 can be formed by etching the solder-mask 30. The etching process, however, may form over-sized or misaligned openings that can cause shorting after subsequent surface mounting processes. For example, opening 34 is over-sized such that the ball-pad 2 and a portion 14 of a trace 12 adjacent to the ball-pad 2 are both exposed. Because of errors in the etching process, other components on the interposer substrate 6 can be inadvertently exposed as well. As the density of components on interposer substrates increases, the probability that adjacent traces or other components will be inadvertently exposed also increases.

B. Embodiments of Fabricating Packaged Microelectronic Device Assemblies

Figure 3A:
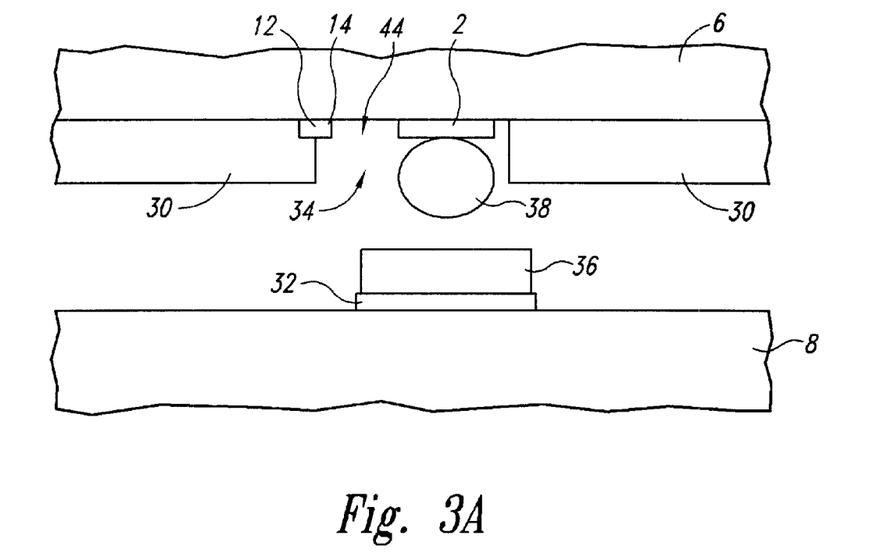
FIGS. 3A and 3B are side cross-sectional views partially illustrating the attachment of a solder-ball on a packaged microelectronic device to a contact on a circuit board.

FIG. 3A is a cross-sectional side view illustrating a portion of an interposer substrate 6 before it is attached to a printed circuit board 8. More specifically, the section of the interposer substrate 6 shown in FIG. 3A further illustrates the portion 14 of the adjacent trace 12 that is exposed by the flaw in the opening 34. A solder-ball 38 deposited on the ball-pad 2 after forming the opening 34 will not typically contact the adjacent trace 12 because of the wetting properties between the solder-ball 38 and the ball-pad 2. The printed circuit board 8 has a contact 32 and a mass of solder paste 36 on-the contact 32. The solder paste 36 can be deposited by screen printing, using a pin transfer mechanism, or any other method known to those of ordinary skill in the art. The solder paste 36 can be a eutectic paste so that it will melt at a lower temperature than the solder-ball 38 and the contact 32, thereby allowing, if necessary, removal of the solder-ball 38 and rework without damage to the components. At this stage, the printed circuit board 8 can be attached to the interposer substrate 6.

Figure 3B:
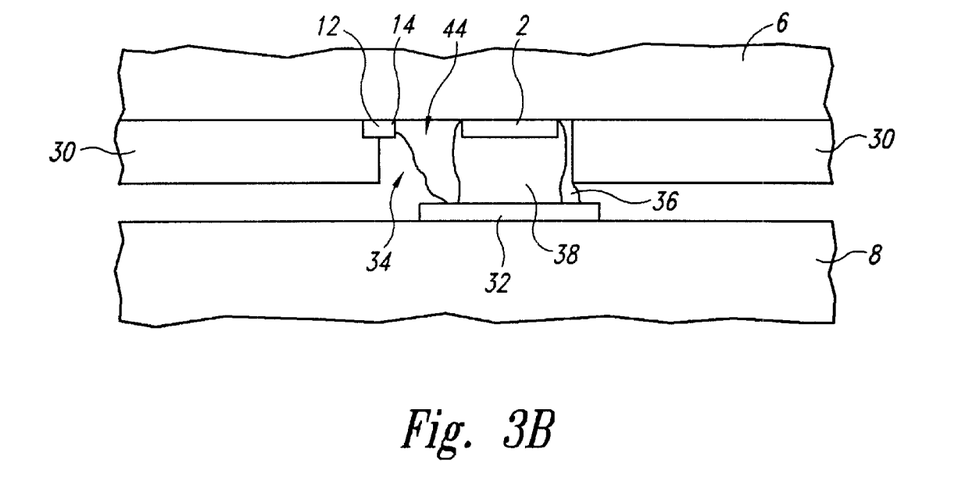

FIG. 3B is a cross-sectional side view after the interposer substrate 6 has been attached to the printed circuit board 8 in accordance with conventional practices. To attach the interposer substrate 6 to the printed circuit board 8, the solder-ball 38 is pressed into the solder paste 36 until the solder-ball 38 approaches or contacts the contact 32 on the printed circuit board 8. After attachment, the interposer substrate 6 and the printed circuit board 8 are heated in a reflow process that melts the solder-ball 38. The solder paste 36 also flows during the reflow process. The molten solder then tools and provides an electrical and mechanical connection between the ball-pad 2 and the contact 32. The melted solder paste 36 also fills a gap 44 between the exposed portion 14 of the adjacent trace 12 and the ball-pad 2 and/or the solder-ball 38 because the opening 34 was too large. Because the solder paste 36 is conductive, filling the gap 44 between the exposed portion 14 of the adjacent trace 12 and the ball-pad 2 and/or solder-ball 38 causes an electrical short. As discussed above, this is a difficult problem for packaged microelectronic device 10 manufacturers because the short is usually not detected in normal quality control procedures. The problem is compounded because the reflow process often occurs after the manufacturer has sold the device 10. Therefore, the electrical short generally can only be detected at the customer's site.

Figure 4A:
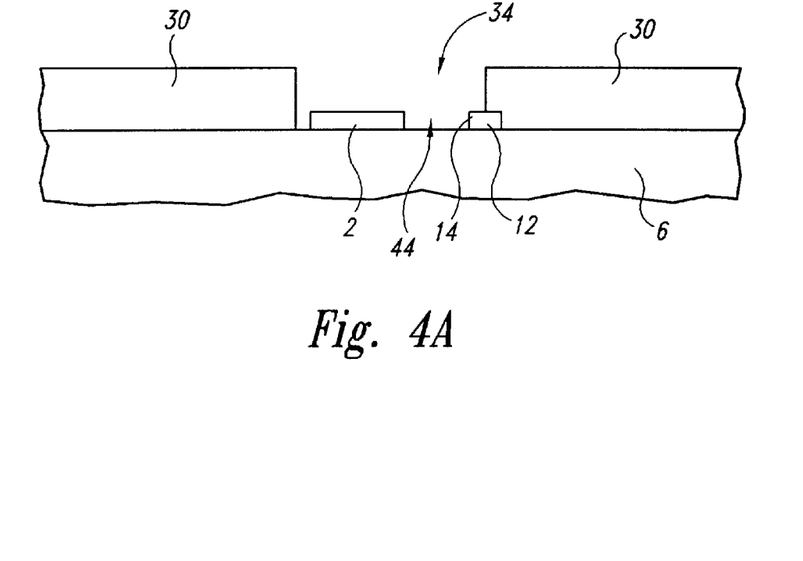
FIGS. 4A–4D are side cross-sectional views partially illustrating a method of manufacturing a microelectronic device and attaching it to a circuit board in accordance with one embodiment of the invention.
Figure 4B:
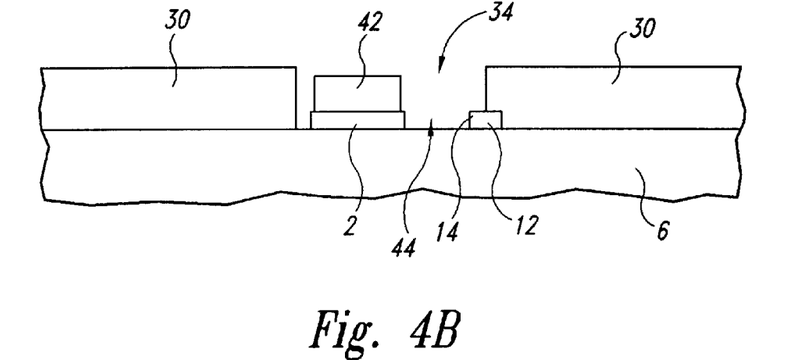
Figure 4C:
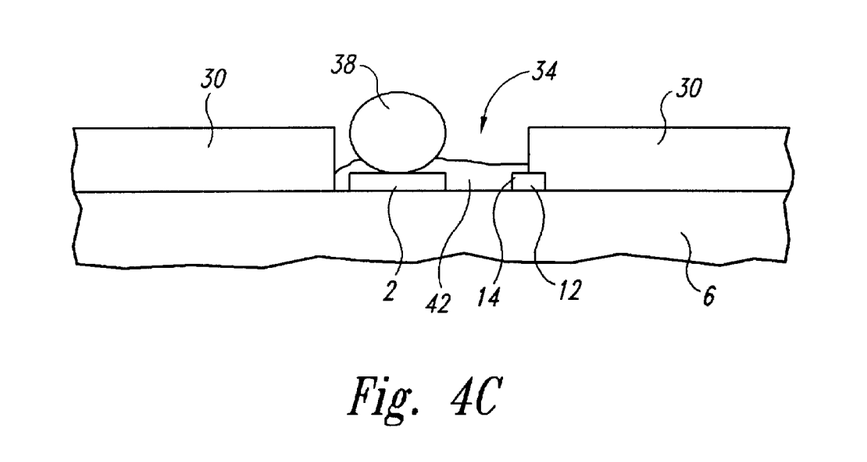

FIGS. 4A–4C illustrate an embodiment of a device and a method for manufacturing a microelectronic device that addresses the problems caused by exposing a portion of a trace that is adjacent to a ball-pad. The reference numbers in FIGS. 4A–7 correspond to the reference numbers in FIGS. 3A and 3B, and thus like reference numbers refer to like components in FIGS. 3A–7.

FIG. 4A illustrates the details of the interposer substrate 6 and the solder-mask layer 30 with the opening 34 as shown in FIG. 3A. Referring to FIG. 4B, the next stage of the method involves depositing a dielectric compound 42 onto the ball-pad 2. The dielectric compound 42 is made of nonconductive material, and thus it can produce a dielectric protective barrier between the exposed portion 14 of the adjacent trace 12 and the ball-pad 2 and/or a solder-ball. The dielectric compound 42 also serves as a temporary adhesive (until reflow) to hold the solder-ball onto the ball-pad 2.

In one embodiment, the dielectric compound 42 is a dielectric flux. The dielectric flux has the advantage of serving a wetting function to help spread out a molten solder-ball over the metallic ball-pad 2. Furthermore, the dielectric flux reduces oxidation on the solder-ball during the reflow process period. The dielectric compound 42 can be a composition including 50%–90% of epoxy resins, 10%–50% of an aliphatic amine complex, and 3%–7% of an aromatic amine derivative. 3M Company of St. Paul, Minn. distributes one such compound as developmental material AHS-550. In another embodiment, the dielectric compound 42 is developmental material AHS-497, also manufactured by 3M Company. In other embodiments, the dielectric compound 42 is Sumiresin CRP-4700-5, Alpha-Fry Technologies DP0071, or other no-flow underfill compounds made by Dexter, Kester or Alpha.

The dielectric compound 42 can be deposited onto the ball-pad 2 by a screen printing procedure. In screen printing, a stencil is placed slightly above the interposer substrate 6 and a squeegee is drawn over the stencil forcing the dielectric compound 42 through the screen and onto the ball-pad 2. In another embodiment, the dielectric compound 42 is deposited onto the ball-pad 2 with a pin transfer mechanism. In a pin transfer process, dull pins are dipped into the dielectric compound 42, and then the ends of the pins are dabbed onto the ball-pads 2. Those of ordinary skill in the art will recognize other methods can be used to deposit the dielectric compound 42 onto the ball-pad 2.

Referring to FIG. 4C, after the dielectric compound 42 has been deposited onto the ball-pad 2, the solder-ball 38 is deposited onto the ball-pad 2. The solder-ball 38 typically displaces the dielectric compound 42 so that the solder-ball 38 directly contacts the ball-pad 2. In one embodiment, the solder-ball 38 is composed of a lead/tin alloy. In other embodiments, the solder-ball 38 is composed of tin or other alloys, such as lead/tin/gold, nickel/palladium, or indium/tin.

The solder-ball 38 causes at least part of the dielectric compound 42 to flow. In one embodiment, the dielectric compound 42 flows and fills the gap 44 between the exposed portion 14 of the adjacent trace 12 and the ball-pad 2. In another embodiment, the dielectric compound 42 flows and covers the exposed portion 14 of the adjacent trace 12. In still another embodiment, the dielectric compound 42 flows and forms a perimeter around a portion of the solder-ball 38 and the ball-pad 2. Those of ordinary skill in the art will appreciate that the dielectric compound 42 can flow to any position such that it forms a barrier over the exposed portion 14 of the adjacent trace 12.

Figure 4D:
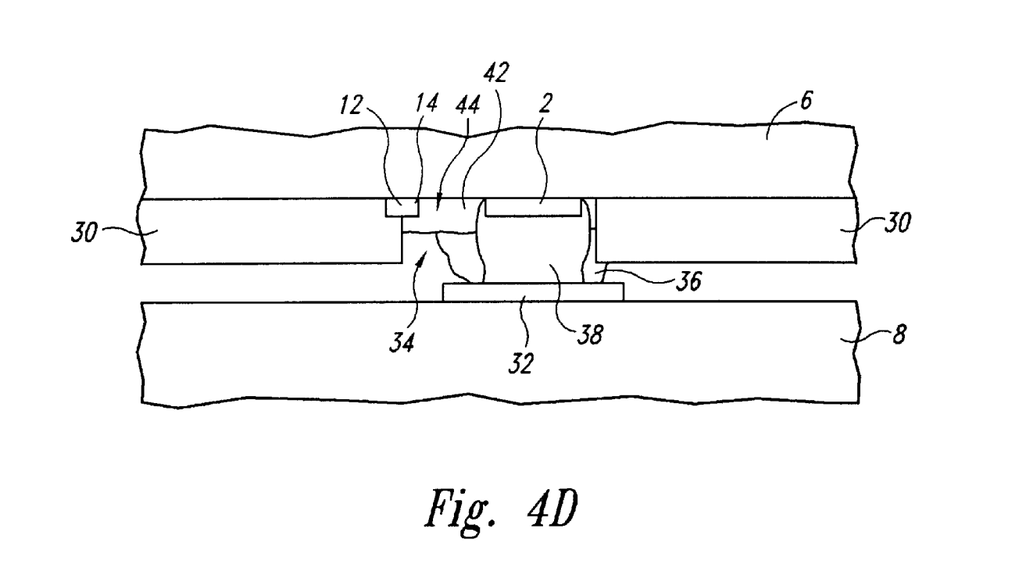

After depositing the solder-ball 38 onto the ball-pad 2, the interposer substrate 6 is ready for attachment to the printed circuit board 8. FIG. 4D illustrates one embodiment in which the solder-ball 38 is pressed into the solder paste 36 until it touches the contact 32. The interposer substrate 6 and the printed circuit board 8 are then heated such that the solder-ball 38 melts and creates both an electrical and mechanical connection between the ball-pad 2 and the contact 32. The solder paste 36 also flows during reflow. The dielectric compound 42, however, prevents the conductive solder paste 36 or any portion of the solder-ball 38 from filling the gap 44 between the exposed portion 14 of the adjacent trace 12 and the ball-pad 2 and/or the solder-ball 38. Thus, the dielectric compound 42 inhibits electrical shorts when openings in the solder-mask 30 expose traces 12 that are adjacent to ball-pads 2.

One advantage of this embodiment is that it is a low-cost way to avoid shorts between the exposed portion 14 of the adjacent trace 12 and the ball-pad 2 and/or the solder-ball 38. Manufacturers of interposer substrates 6 can sell their products with confidence of high yields because subsequent reflow processes are less likely to produce electrical shorting at the customer's location. Furthermore, manufacturers may be able to use wider traces to reduce trace cracking without the concern of possible shorting.

Another advantage of this embodiment is that the dielectric compound 42 may provide enough support for the solder-ball 38 to eliminate underfilling the interposer substrate 6 after the solder-ball 38 has been deposited. In addition, this embodiment may eliminate the need for a cleaning flux.

Figure 5A:
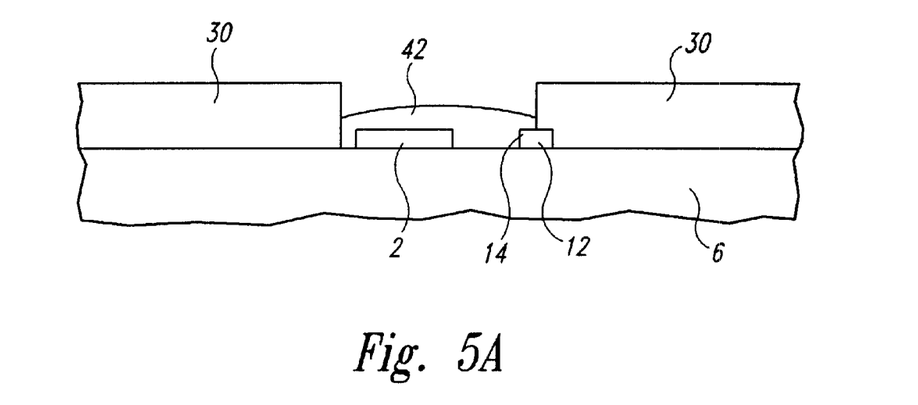
FIGS. 5A and 5B are side cross-sectional views partially illustrating a method of manufacturing a microelectronic device in accordance with another embodiment of the invention.
Figure 5B:
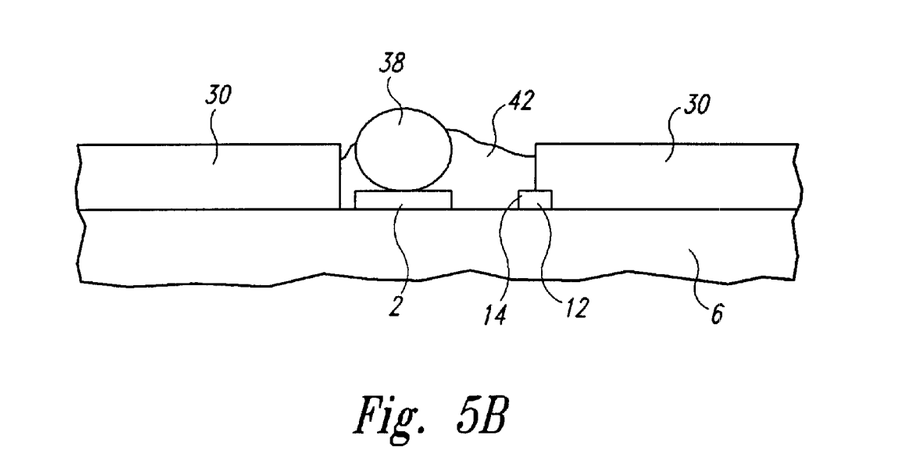

FIGS. 5A–5B depict another embodiment of the invention. Referring to FIG. 5A, the dielectric compound 42 is deposited within the etched opening 34 of the interposer substrate 6 in such a way that the compound 42 covers the ball-pad 2 and the exposed portion 14 of the adjacent trace 12.

Referring to FIG. 5B, the solder-ball 38 is deposited onto the ball-pad 2. The solder-ball 38 displaces the dielectric compound 42 as it is deposited onto the ball-pad 2 so that it can contact the ball-pad 2. The displaced dielectric compound 42 electrically insulates the solder-ball 38 and ball-pad 2 from the exposed portion 14 of the adjacent trace 12. Therefore, subsequently attaching the interposer substrate 6 to a printed circuit board 8 (as described above with reference to FIG. 4D) will not cause a short because the solder paste 36 on the contact 32 of the printed circuit board 8 is precluded from contacting the exposed portion 14 of the adjacent trace 12.

Figure 6:
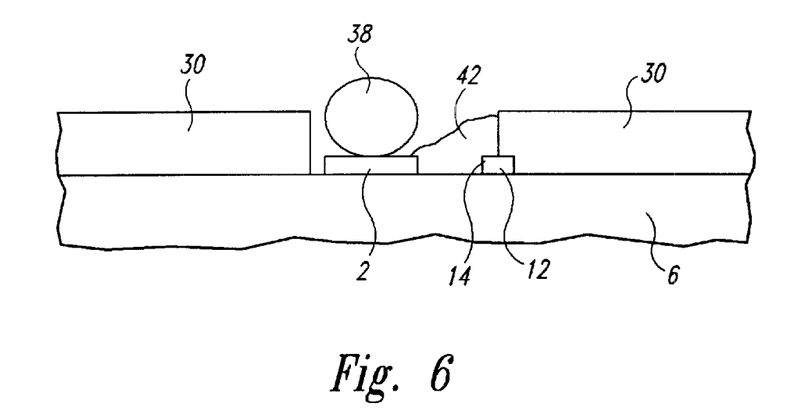
FIG. 6 is a side cross-sectional view illustrating a method of manufacturing a microelectronic device in accordance with another embodiment of the invention.

FIG. 6 illustrates another embodiment of the invention. The dielectric compound 42 is deposited in the gap 44 between the exposed portion 14 of the adjacent trace 12 and the ball-pad 2. The dielectric compound 42 can be deposited in the gap 44 before or after the solder-ball 38 is formed. Therefore, subsequently attaching the interposer substrate 6 to a printed circuit board 8 (as described above with reference to FIG. 4D) will not cause a short because the solder paste 36 on the contact 32 of the printed circuit board 8 is precluded from contacting the exposed portion 14 of the adjacent trace 12.

In other embodiments, the dielectric compound 42 is deposited in other locations such that the exposed portion 14 of the adjacent trace 12 is electrically insulated from the ball-pad 2 and the solder-ball 38 after attaching the interposer substrate 6 to the printed circuit board 8. In one embodiment, the dielectric compound 42 is deposited proximate to the contact 32 on the printed circuit board 8 before attachment to the interposer substrate 6. If solder paste is used, the dielectric compound 42 can be deposited on the contact 32 after the solder paste. Consequently, the dielectric compound 42 will prevent the solder paste from electrically connecting the ball-pad 2 and/or the solder-ball 38 to the exposed portion 14 of the adjacent trace 12. In another embodiment, the dielectric compound 42 is deposited so that it forms, at least partially, a perimeter around the ball-pad 2 and the solder-ball 38. In this embodiment, the dielectric compound 42 would not need to contact the exposed portion 14 of the adjacent trace 12 and the ball-pad 2.

Figure 7:
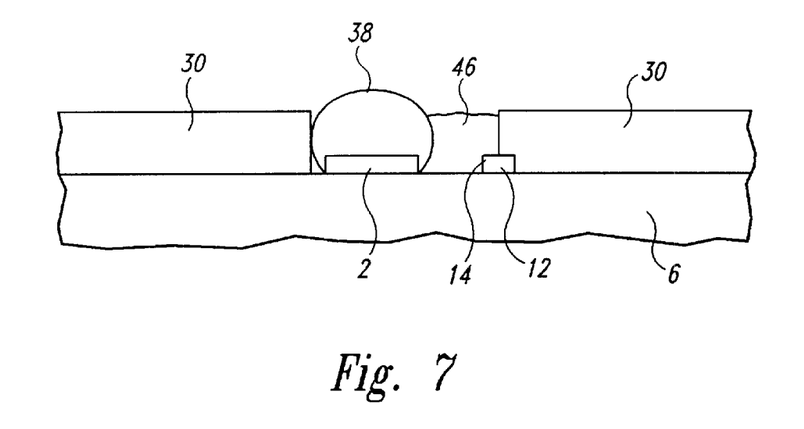
FIG. 7 is a side cross-sectional view illustrating a method of manufacturing a microelectronic device in accordance with another embodiment of the invention.

FIG. 7 illustrates the interposer substrate 6 after it has been cured. Curing causes the dielectric compound 42 to flow and allows the molten solder-ball 38 to displace the dielectric compound 42. Curing also causes the dielectric compound 42 to adhere to the solder-mask 30 and link into a hardened resin 46 for masking the exposed portion 14 of the adjacent trace 12. The hardened resin 46 will also act to support the solder-ball 38 for improving its reliability.

The dielectric compound 42 can be cured before, during, or after the reflow process. The dielectric compound 42 is generally tacky in the precure state, and thus it does not need to be cured to provide a temporary bond between the ball-pad 2 and the solder-ball 38. In one embodiment, as illustrated in FIG. 7, the dielectric compound 42 is cured before the interposer substrate 6 is attached to the printed circuit board 8. In another embodiment, the dielectric compound 42 is cured at least to a "B" stage (partially linked) during the reflow process. If the dielectric compound 42 is cured only to the B stage during reflow, then a post-final cure may be necessary. In another embodiment, the dielectric compound 42 is fully cured during the reflow stage.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method for mounting a packaged microelectronic device to a circuit board, comprising:
   depositing a flowable dielectric compound onto an exposed ball-pad in an opening of the packaged microelectronic device;
   placing a solder-ball onto the ball-pad so that the dielectric compound electrically insulates the ball-pad and the solder-ball from any exposed portion of a trace line adjacent to the ball-pad in the opening; and
   attaching a contact on the circuit board to the solder-ball of the microelectronic device.

2. The method of claim 1 wherein depositing a flowable dielectric compound comprises dispensing a dielectric flux onto the ball-pad.

3. The method of claim 1 wherein depositing a flowable dielectric compound comprises dispensing a dielectric flux comprising epoxy resins, an aliphatic amine complex, and an aromatic amine derivative.

4. The method of claim 1 wherein depositing a flowable dielectric compound comprises dispensing a dielectric flux comprising 50–90 percent epoxy resins, 10–50 percent aliphatic amine complex, and 3–7 percent aromatic amine derivative.

5. The method of claim 1 wherein depositing a flowable dielectric compound comprises dispensing a dielectric flux comprising a no flow underfill.

6. The method of claim 1 wherein:
   a eutectic paste is on the contact on the circuit board; and
   attaching a contact on the circuit board to the solder-ball comprises pressing the solder-ball into the eutectic paste.

7. The method of claim 1, further comprising etching away a portion of a solder-mask on the packaged microelectronic device creating the opening.

8. The method of claim 1 wherein depositing a flowable dielectric compound comprises screen printing the flowable dielectric compound onto the ball-pad.

9. The method of claim 1 wherein depositing a flowable dielectric compound comprises dispensing the flowable dielectric compound onto the ball-pad with a pin transfer mechanism.

10. The method of claim 1 wherein depositing a flowable dielectric compound further includes dispensing the flowable dielectric compound onto an exposed portion of the trace line adjacent to the ball-pad in the opening.

11. The method of claim 1, further comprising at least partially curing the dielectric compound before attaching a contact on the circuit board to the solder-ball.

12. The method of claim 1, further comprising curing the dielectric compound after attaching a contact on the circuit board to the solder-ball.

13. A method for mounting a packaged microelectronic device to a circuit board, comprising:
   placing a solder-ball onto a ball-pad in an opening of the packaged microelectronic device proximate to an exposed portion of an adjacent trace;
   depositing a dielectric compound proximate to a contact on the circuit board;
   displacing at least part of the dielectric compound such that at least part of the dielectric compound covers the exposed portion of the adjacent trace; and
   attaching the contact on the circuit board to the solder-ball of the microelectronic device.

14. The method of claim 13 wherein:
   a eutectic paste is on the contact on the circuit board; and attaching a contact on the circuit board to the solder-ball comprises pressing the solder-ball into the eutectic paste.

15. The method of claim 13 wherein depositing a dielectric compound comprises dispensing a dielectric flux proximate to the contact on the circuit board.

16. The method of claim 13 wherein depositing a dielectric compound comprises dispensing epoxy resins, an aliphatic amine complex, and an aromatic amine derivative.

17. A method for mounting a packaged microelectronic device to a circuit board, comprising:

covering ball-pads on an interposer substrate with a solder-mask;

forming an opening in the solder-mask over a ball-pad on the interposer substrate;

depositing a dielectric compound in the opening;

placing a solder-ball onto the ball-pad;

attaching a contact on the circuit board to the solder-ball of the microelectronic die; and curing the dielectric compound so that the compound electrically insulates the ball-pad and the solder-ball from an adjacent trace line.

18. The method of claim 17 wherein depositing a dielectric compound in the opening comprises dispensing a dielectric flux in the opening.

19. The method of claim 17 wherein depositing a dielectric compound in the opening comprises dispensing a dielectric flux comprising epoxy resins, an aliphatic amine complex, and an aromatic amine derivative.

20. The method of claim 17 wherein forming an opening in the solder-mask comprises etching a hole in the solder-mask.

21. The method of claim 17 wherein:

a eutectic paste is on the contact on the circuit board; and attaching a contact on the circuit board to the solder-ball comprises pressing the solder-ball into the eutectic paste.

22. A method of manufacturing a microelectronic device, comprising:

covering ball-pads on an interposer substrate with a solder-mask;

forming an opening in the solder-mask over a ball-pad on the interposer substrate;

depositing a dielectric compound in the opening; and placing a solder-ball onto the ball-pad so that the dielectric compound electrically insulates the ball-pad and the solder-ball from any exposed portion of a trace line adjacent to the ball-pad in the opening.

23. The method of claim 22 wherein depositing a dielectric compound comprises dispensing a dielectric flux.

24. The method of claim 22 wherein depositing a dielectric compound comprises dispensing a dielectric flux comprising epoxy resins, an aliphatic amine complex, and an aromatic amine derivative.

25. The method of claim 22 wherein depositing a dielectric compound comprises dispensing a dielectric flux comprising 50–90 percent epoxy resins, 10–50 percent aliphatic amine complex, and 3–7 percent an aromatic amine derivative.

26. The method of claim 22 wherein depositing a dielectric compound comprises dispensing a dielectric flux comprising a no flow underfill.

27. The method of claim 22 wherein depositing a dielectric compound comprises screen printing the dielectric compound into the opening.

28. The method of claim 22 wherein depositing a dielectric compound comprises dispensing the dielectric compound into the opening with a pin transfer mechanism.

29. The method of claim 22 wherein depositing a dielectric compound further includes dispensing the dielectric compound onto an exposed portion of the trace line adjacent to the ball-pad in the opening.

30. The method of claim 22, further comprising at least partially curing the dielectric compound.

31. The method of claim 22 wherein forming an opening in the solder-mask comprises etching a hole in the solder-mask.

32. A method of manufacturing a microelectronic device, comprising:

covering a ball-pad on an interposer substrate with a solder-mask;

forming an opening in the solder-mask over the ball-pad on the interposer substrate;

depositing a dielectric compound on the ball-pad; and placing a solder-ball onto the ball-pad so that the dielectric compound is displaced and surrounds a perimeter portion of the solder-ball.

33. The method of claim 32 wherein depositing a dielectric compound on the ball-pad comprises dispensing a dielectric flux onto the ball-pad.

34. The method of claim 32 wherein forming an opening in the solder-mask comprises etching a hole in the solder-mask.

35. A method of manufacturing a packaged microelectronic device having a die including a bond-pad and an interposer substrate including at least one ball-pad electrically coupled to the bond-pad on the die, comprising:

disposing a solder-mask on an interposer substrate to cover the ball-pad;

forming an opening in the solder-mask over the ball-pad;

placing a solder-ball onto the ball-pad; and insulating electrically the solder-ball and ball-pad from an exposed portion of an adjacent trace line in the opening.

36. The method of claim 35 wherein insulating electrically the solder-ball and the ball-pad comprises dispensing a dielectric flux into the opening.

37. The method of claim 35 wherein forming an opening in the solder-mask comprises etching a hole in the solder-mask.

* * * * *

UNITED STATES PATENT AND TRADEMARK OFFICE
CERTIFICATE OF CORRECTION

PATENT NO.    : 6,622,380 B1                                                     Page 1 of 1
DATED         : September 23, 2003
INVENTOR(S)   : Ford B. Grigg It is certified that error appears in the above-identified patent and that said Letters Patent is hereby corrected as shown below:

<u>Column 4,</u>
Line 6, delete period between "4" and "before";
Line 20, delete comma between "small" and "contacts";
Line 63, "on-the" should be -- on the --;

<u>Column 5,</u>
Line 15, "tools" should be -- cools --;

Signed and Sealed this

Ninth Day of December, 2003

JAMES E. ROGAN
*Director of the United States Patent and Trademark Office*